(12) United States Patent
Podkolzin et al.

(10) Patent No.: US 6,868,535 B1
(45) Date of Patent: Mar. 15, 2005

(54) METHOD AND APPARATUS FOR OPTIMIZING THE TIMING OF INTEGRATED CIRCUITS

(75) Inventors: Alexander S. Podkolzin, Moscow (RU); Valery D. Kudryavtsev, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 677 days.

(21) Appl. No.: 09/879,841

(22) Filed: Jun. 12, 2001

(51) Int. Cl.[7] .............................................. G06F 17/50
(52) U.S. Cl. ................................. 716/18; 716/1; 716/2; 716/10
(58) Field of Search ........................... 716/1, 2, 10, 18, 716/4, 6

(56) References Cited

U.S. PATENT DOCUMENTS 6,591,407 B1 * 7/2003 Kaufman et al. ............. 716/10

* cited by examiner

*Primary Examiner*—Thuan Do
(74) *Attorney, Agent, or Firm*—Westman, Champlin & Kelly

(57) ABSTRACT

Integrated circuits are designed having optimal signal timing between and among cells. A set of identities are generated corresponding to logic operations and to library cells in technology basis. A resynthesis window is created for the identities having less than a predetermined depth of critical variables. Logic equations of the resynthesis window are transformed using the identities, and the resynthesized window area is optimized.

17 Claims, 4 Drawing Sheets

METHOD AND APPARATUS FOR OPTIMIZING THE TIMING OF INTEGRATED CIRCUITS

FIELD OF THE INVENTION

This invention relates to design of integrated circuits, and particularly to designing integrated circuits having optimal signal timing.

BACKGROUND OF THE INVENTION

Integrated circuits (ICs) comprise plural cells each consisting of one or more circuit elements, such as transistors, capacitors and other devices, grouped to perform a specific logic function. Each cell has one or more pins which are connected by wires to one or more pins of other cells of the IC. A net is the set of pins connected by the wire; a netlist is a list of nets of the IC. The IC may also include plural functional circuit blocks, such as central processing units, memories and input/output interface units. The cells and circuit blocks are represented as standard designs in technology-specific circuit libraries. The IC is constructed using selected circuit blocks and millions of cells.

Computer aided design (CAD) tools are used in most phases of the circuit design and layout processes. The layout is typically partitioned by grouping the components into blocks defining subcircuits and modules and interconnecting the blocks with wires according to the netlist. Routing channels are defined between the blocks of a layout, and wires connect the blocks along the shortest possible paths within the channels.

One measure of the performance of an IC is expressed by the time delays, including propagation delays and setup/hold delays, within the circuit. Propagation delays include the time required for a signal to travel from the input to the output of a cell. A setup delay is the time required by the cell that a signal must be available at an input prior to a clock signal transition. A hold delay is the time duration that a signal is required to be stable after a clock signal transition.

An important consideration in the design and layout of ICs is the optimization of signal timing through the IC so that signals are available at the correct pin just in time for an event to be performed by the cell. In the past, signal timing optimization was addressed after initial layout of the blocks and during the routing of wires between the blocks. Timing considerations often led to repositioning blocks and re-routing the wires during this design phase. The present invention is directed to a technique of optimization that is applied to the logical equations in operations of the technology basis to maximize signal timing optimization.

SUMMARY OF THE INVENTION

In one embodiment of the invention, a plurality of identities are generated representing a union of the axioms of plural logic operations and the functional definitions of the cells in a given technology basis. A resynthesis window is created, and the resulting logic equations are transformed through the identities. The resynthesis window area is then optimized.

In other embodiments of the invention, the process is carried out by a computer operating under the control of a computer readable program that contains computer readable code that, when read and processed by the computer, causes the computer to perform the process. In preferred embodiments, the computer readable program is embedded on a computer readable medium, such as a recordable disk of a computer disk drive.

DETAILED DESCRIPTION OF THE PREFERRED EMBODIMENTS

The present invention is based on a preliminary generation of identities in the technology basis. The identities minimize the depth of variables with critical timing. The generation of identities is automatic, so the timing optimization procedure is independent from the choice of a specific technology basis.

Figure 1:
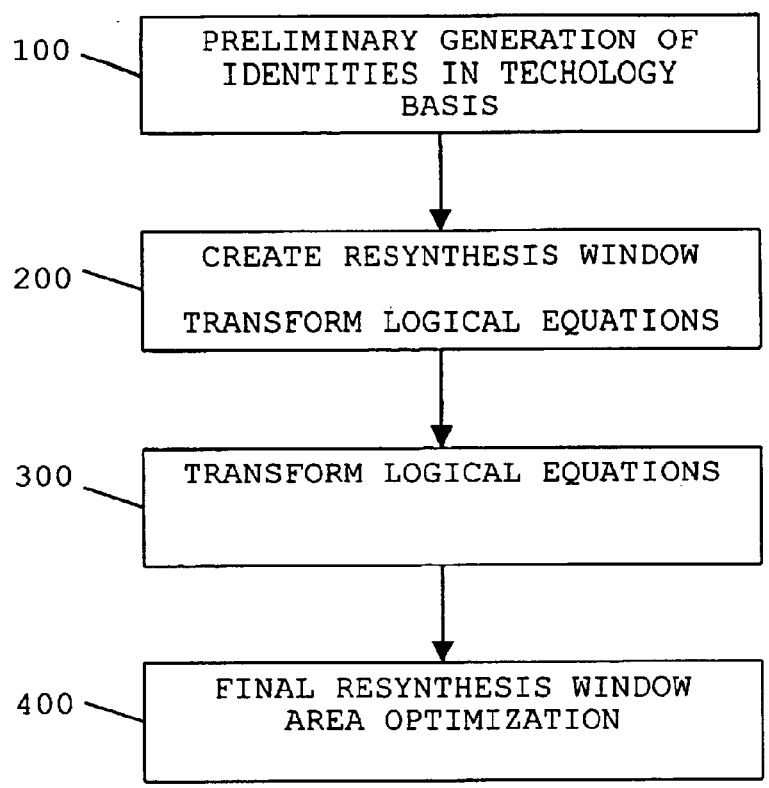
FIG. 1 is a flow chart of the process of the present invention.

FIG. 1 is a flowchart illustrating the general procedure of the present invention. At step 100, a preliminary set of identities for the given technology basis are generated. A resynthesis window is created at step 200, and its logical equations are transformed for better applicability of identities. The logical equations are transformed through the identities at step 300. At step 400 final resynthesis window area optimization is performed without degrading timing.

Step 100. Identities Generation.

An identities generation algorithm is used to generate identities in the technological basis. Each identity diminishes the depth of a variable (e.g., $x_1$). In the process of timing optimization, this variable is identified by a subexpression of critical timing. While generation of identities of only one variable is considered critical, we have discovered numerous situations where an identity diminishes timing for critical and quasi-critical variables.

Figure 2:
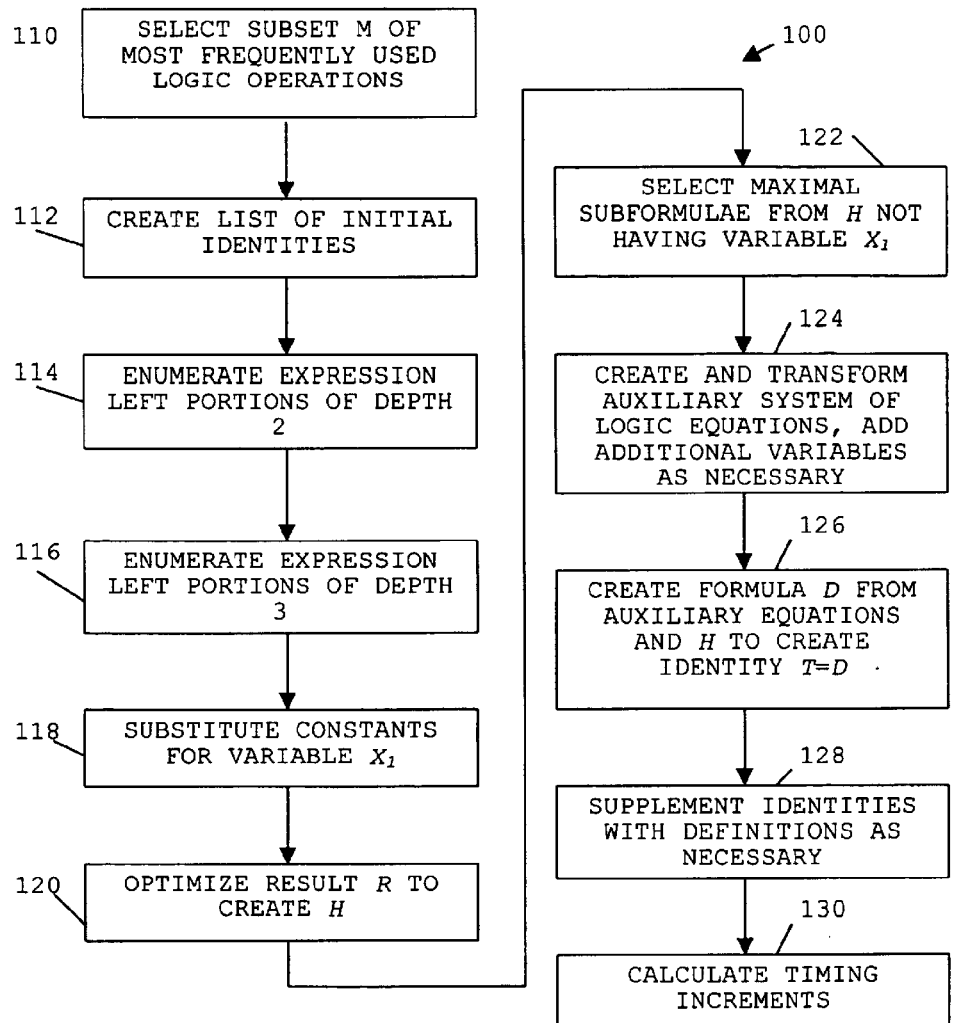
FIGS. 2–5 are flow charts of portions of the process illustrated in FIG. 1.

The process 100 of generating preliminary identities for the technology basis is illustrated in the flow chart of FIG. 2. A subset M of most frequently used current design logic operations of the technology basis (for example, NOT, OR, AND, NOR, NAND, XOR, MUX, etc.) is selected at step 110. The number of inputs m of each operation is not more than some predetermined number, such as 4. To obtain a practical number of identities, it is desirable to select not more than about 30 to 40 logic operations in subset M.

At step 112, a list of initial identities is created. Each identity is a union of (1) the axioms of the logic operations in M and (2) the definitions of functions of the logic cells of the technology basis in terms of logic operations. The left parts of these identities are enumerated. There are two types of left parts, expressions with a depth 2 and expressions with depth 3. At step 114 an enumeration is made of all expressions of depth 2, having a form $f_1(y_1 \ldots y_{i-1} f_2(x_1 \ldots x_n) y_{i+1} \ldots y_m)$, where $f_1, f_2$ are from subset M. Here, $y_1, \ldots y_m, x_1, \ldots, x_n$, are different variables. Expressions are considered identical if they can be transformed to another by reordering operands of "symmetrical" operations $f_1$ and by renaming all of the variables except $x_1$ ($x_1$ is considered as critical by timing). During enumeration of the left parts of the identities, some of these left parts would be created as identities themselves, as described below.

After completing enumeration of the left parts of depth 2, enumeration of left parts that have depth 3 is performed at step 116. Here, the expressions take on the form $f_1(z_1 \ldots z_{i-1} f_2(y_1 \ldots y_{j-1} f_3(x_1 \ldots x_n) y_{j+1} \ldots y_m) z_{i+1} \ldots z_k)$. All expressions that have a subexpression A from depth 2 are excluded from this enumeration because an identity A=B has already been generated.

For every left part T of the identity that appears during enumeration process, an attempt is made to generate a corresponding right part pursuant to steps 118–130.

At step 118, constants 0,1 are substituted for variable $x_1$ in the left part expression T of the identity, creating results $R_0, R_1$. Simple identities are applied for logical constants (i.e., $1 \vee x = 1$; $0 \vee x = x$, etc.). An expression $R = x_1 \cdot R_1 \vee \neg x_1 \cdot R_0$ is created, where disjunction, conjunction and negation are elements of the basic set of operations M.

At step 120, expression R is optimized by a timing optimization procedure using identities that have double occurrences of the same variable in right part. Application of this identity is equivalent to modification of factoring (that is, regrouping of implicants, oriented to diminishing the critical variable depth). The process of timing optimization for R assumes that timing of variable $x_1$ is greater than sum of delays of all operations in R, and that timings of other variables in R are equal to 0. The simplest model of timing is used here so that each operation in M has a fixed delay. The result of transformations of the expression R is designated by H.

Maximal subexpressions $P_1, \ldots, P_n$ are selected at step 122 from expression H that do not have variable $x_1$. Arbitrary new variables $y_1, \ldots, y_n$ (that is, variables not used in H) are selected at step 124 and an auxiliary system of logical equations $y_1 = P_1, \ldots, y_n = P_n$ in technology basis is created. More particularly, the logical equations are transformed to basis OR, AND and NOT. The right parts of equations are transformed to disjunctive normal form and minimized (by an ordinary flattening procedure). A factoring procedure is applied to system of equations. Finally, a procedure of mapping-to-gates is applied to system of equations. It may be necessary to add additional new variables $z_1, \ldots, z_m$ during the factoring procedure. These new variables are designations for some subexpressions, $B_1, \ldots B_m$, that have more than one occurrence in equations. The transformation of the auxiliary equations results in a new system of equations $y_1 = Q_1, \ldots, y_n = Q_n, z_1 + B_1, \ldots, z_m = B_m$.

At step 126, expression D is created by replacing subexpressions $P_1, \ldots, P_n$ in expression H with $Q_1, \ldots, Q_n$. The result is an identity T=D. However, if m>0, the identity is supplemented, as indicated at step 128, with a system of equations $z_1 = B_1, \ldots, z_m = B_m$, which are definitions of auxiliary variables $z_1, \ldots, z$ in D. These identities (where m>0) can be considered "identities with definitions".

Increments of timing and area for replacement of T to D are calculated at step 130. For example, for the simplest timing model, every operation from M has fixed delay and area, variable $x_1$ has fixed "large" timing, and other variables have timing 0. If the decrease of timing is not less than given parameter $\Delta$, and the increase of area is not more than given percent S, then the identity with definitions T=D is registered in list of resulting identities. Otherwise the identity is missing. Parameters $\Delta$, S are determined experimentally. In experiments, we chose $\Delta$ as one-half of the mean delay of operations from M, and S as 40%.

For two examples of identities generated by this procedure, assume $AO1(x_1 x_2 x_3 x_4) = NOT(AND(OR(x_1 x_2) x_3 x_4))$ and $AO2(x_1 x_2 x_3 x_4) = NOT(OR(AND(x_1 x_2) AND(x_3 x_4)))$.

The first of these identities is $AO1(x_2 x_3 x_4 AND(x_1 x_5)) = NAND(x_1 NOT(AO1(x_2 x_3 x_4 x_5)))$, which is the usual identity for replacement of left part to right part. The second identity is $AO2(OR(x_1 x_2) x_3 x_4 x_5)\ AO1(x_1 OR(x_3 x_6)); x_6 = AND(x_4 x_5)$, which is an identity with a definition of auxiliary variable $x_6$.

Step 200. Generation of resynthesis window and transformation of equations.

Figure 3:
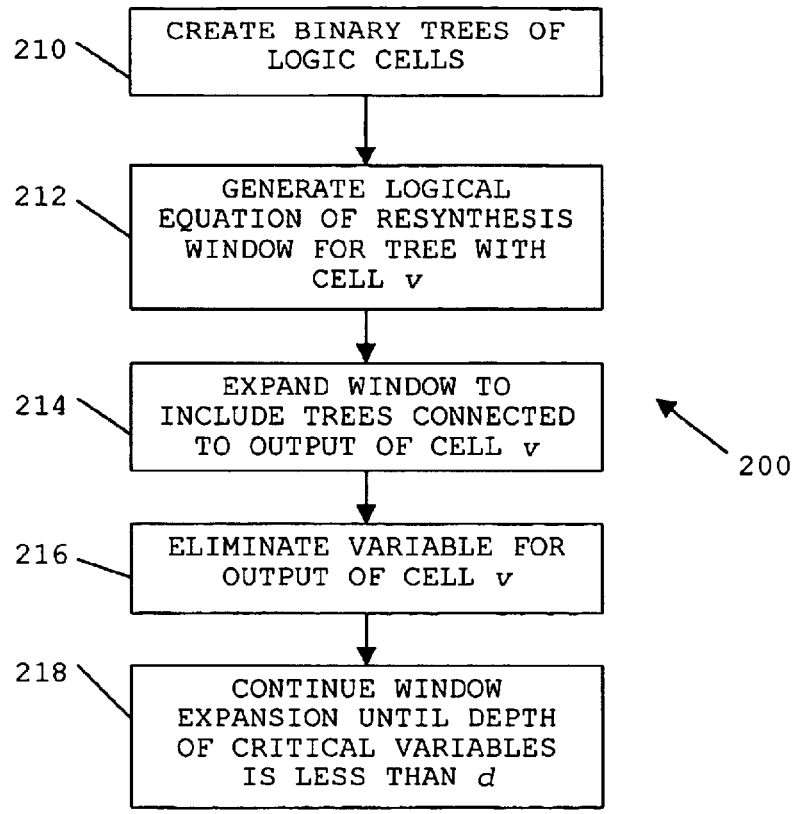

FIG. 3 is a flow chart of the process of step 200 in FIG. 1. A list C of all critical timing cells of the netlist is created by standard procedures. At step 210 binary trees are formed having levels of vertices. The vertices represent logical cells, and are arranged such that each vertex representing a cell inside the tree (i.e., at levels other than a bottom level of the tree) has its output connected to another vertex representing another cell of the same tree. The bottom level vertices represent output cells. The tree is "maximal", in the sense that no cell can be added to it. The tree is used to generate a window for resynthesis. At step 212, a tree is selected containing an output cell v in list C. The tree containing output cell v gives a logical equation of the resynthesis window as y=F. If the maximal depth of variables with critical timing in F is not less than some parameter d, then the window is expanded.

Window expansion is performed at step 214 by identifying all trees that have inputs connected to output of cell v. The resynthesis window is expanded to include all identified trees. Hence, all trees containing a cell connected to an output of cell v are included in the expanded tree. The resulting tree adds new logical equations $z_1 = G_1, \ldots, z_n = G_n$ for resynthesis.

Variable y appears in all expressions $G_1, \ldots, G_n$ for the output of cell v. Variable y is eliminated from the resynthesis window by substituting F for y in all expressions $G_1, \ldots, G_n$ and by deleting equation y=F. This transformation often increases the depth of variables with critical timing, and therefore creates more possibilities for application of identities generated above, although application of any such identity requires a depth of at least 2, and preferably 3.

The process of window expansion and transformation continues until the depth of critical variables in all equations is less than d, and total complexity of the equations is less than some critical value.

Step 300. Logical Equation Transformation.

Figure 4:
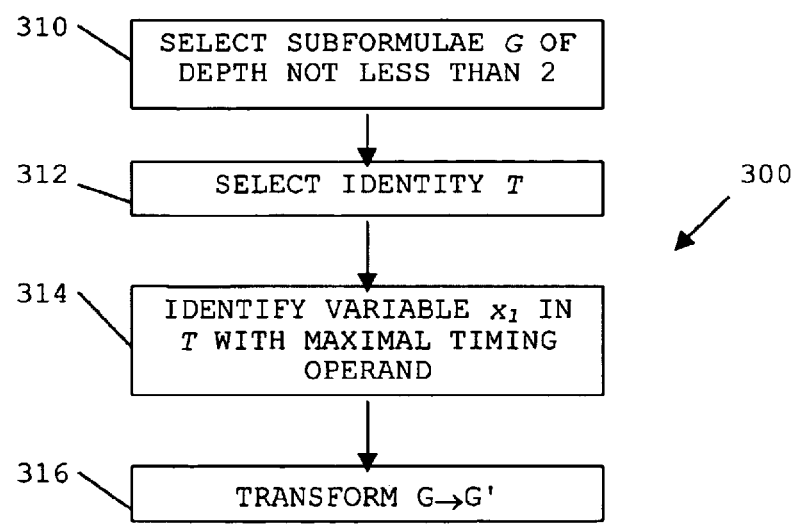

Let $y_1 = F_1, \ldots, y_n = F_n$ be the system of logical equations, in terms of technology basis operations, for the current resynthesis window. Elaboration of these equations is performed as described in the flow chart of FIG. 4.

All subexpressions G of expressions $F_i$ having critical timing and a depth not less than 2, are selected. If a subexpression G has a depth of 2 or less, it is ignored. Each subexpression G is presented in form $$f_1( \ldots f_2 ( \ldots f_m(A_1 \ldots A_p) \ldots ) \ldots ),$$

where $f_{i+1}$ are operands of operation $f_i$ with maximal timing, and m<4. An identity T with left part of the same form $f_1( \ldots f_m( \ldots ) \ldots 0 \ldots )$ is selected from the base of identities. Variable $x_1$ of the selected identity T is identified with operand $A_j$ having a maximal timing.

The total number of identities may appear to be very large. Since the left parts of the identities have "linear" structure of operations, the identities can be organized into tree-like databases for a quick search. Since the time required to perform the search is logarithmic of the number of identities, the quick search is possible for millions of such identities. When the identity T is found, the result G' of application of T to subexpression G is considered, and the decrement $\delta$ of timing for $F_i$ is computed. After all subexpressions G are considered, a variant of transformation G→G' is selected, which gives maximal diminishing of timing (i.e., minimal decrement $\delta$, $\delta<0$). This transformation G→G' is realized, and the cycle is repeated. Transformations are continued until δ is less than 0. If an identify T defined some auxiliary variables, then the definitions of these variables are included in the list of equations.

Step 400. Final Resynthesis Window Area Optimization.

Figure 5:
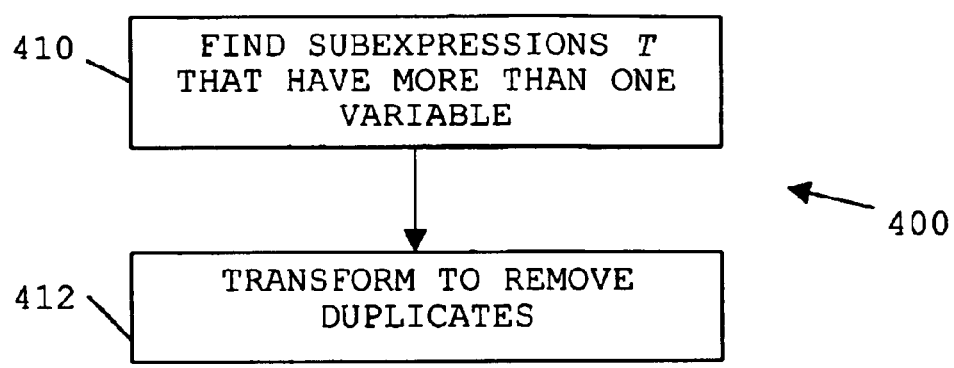

FIG. 5 is a flow chart illustrating the process of step 400 in FIG. 1. At step 410 subexpressions T are found in equations $y_1=F_1, \ldots y_n=F_n$ of the resynthesis window that have more than one occurrence. New variables z are selected, and at step 412 all occurrences of T in equations are replaced with z. An equation z=T is added to system of equations. These transformations are necessary to remove duplications that appeared in the equations as a result of elimination of variables in step 200. Alternatively (or supplementally), duplication can be removed by selecting non-critical (by timing) subexpressions $P_1, \ldots, P_m$ of the equations and minimizing their complexity by standard area optimization cycles of flattening, factoring and mapping-to-gates. Replacement of subexpressions $P_i$ by result $R_i$ of such cycle is permissible if it does not negatively impact the results of timing optimization.

While the invention has been described as a process, in preferred embodiments the invention is carried out by a computer under the control of a computer readable program comprising computer readable code embedded in a computer readable medium. The code of the computer readable program causes the computer to carry out the processes herein described. The computer readable program may be part of a computer aided design program for carrying out the process to design integrated circuits having millions of cells.

Although the present invention has been described with reference to preferred embodiments, workers skilled in the art will recognize that changes may be made in form and detail without departing from the spirit and scope of the invention.

What is claimed is:

1. A process of designing an integrated circuit having optimal signal timing comprising steps of:
   a) generating a plurality of identities based on logic operations and library cells in technology basis;
   b) creating a resynthesis window having less than a predetermined depth of critical variables, by:
      b1) forming a plurality of binary trees whose vertices represent logic cells,
      b2) defining a logic equation of the resynthesis window from a tree having an output cell having a critical timing, and
      b3) expanding the window to include additional trees that have inputs connected to the selected output cell, and
      b4) transforming the logic equations;
   c) transforming logic equations from the resynthesis window using the identities; and
   d) optimizing the resynthesis window area.

2. The process of claim 1, wherein step (a) includes steps of:
   a1) selecting a set of most frequently used logic operations in the integrated circuit,
   a2) creating a list of initial identities identifying a union of the axioms of the logic operations of the set and logic cell definitions in the technology basis,
   a3) enumerating left parts of the identities, and
   a4) generating corresponding right parts for each enumerated left part.

3. The process of claim 2, wherein the identities have a depth of 2 or 3 and step (a3) includes steps of:
   enumerating left parts of the identities having a depth of 2, and
   subsequently enumerating left parts of the identities having a depth of 3.

4. The process of claim 2, wherein step (a4) includes steps of:
   a4A) substituting constants for variables in left parts,
   a4B) optimizing the results of step (a4A),
   a4C) creating an auxiliary system of logic equations based on the results of step (a4B), and
   a4D) creating an identity based on the results of steps (a4B) and (a4C).

5. The process of claim 1, wherein step (b) further includes:
   b5) iteratively repeating steps (b3) and (b4) until the variables in the logic equations having critical timing have a maximal depth less than the predetermined depth.

6. The process of claim 1, wherein step (c) includes steps of:
   c1) selecting subexpressions of the logic equations having depths not less than 2,
   c2) selecting a variable having a maximal timing operand from an identity associated with one of the subexpressions, and
   c3) transforming the selected subexpression to minimize timing of the variable.

7. The process of claim 1, wherein step (d) includes steps of:
   d1) identifying identities having more than one variable, and
   d2) transforming the identified identities to remove duplicate variables.

8. The process of claim 7, wherein step d2) includes steps of:
   selecting non-critical subexpressions of the identities, and optimizing the area of the associated cells to minimize complexity.

9. A computer usable medium having a computer readable program embodied therein for addressing data to cause a computer to design an integrated circuit having an optimal signal timing, the computer readable program in the computer usable medium comprising:
   first computer readable program code for causing the computer to generate a plurality of identities based on logic operations and library cells in the technology basis of the integrated circuit;
   second computer readable program code for causing the computer to create a resynthesis window having less than a predetermined depth of critical variables;
   third computer readable program code for causing the computer to transform logic equations from the resynthesis window using the identities;
   fourth computer readable program code for causing the computer to optimize the resynthesis window area;
   fifth computer readable program code for causing the computer to select a set of most frequently used logic operations in the integrated circuit;
   sixth computer readable program code for causing the computer to create a list of initial identities identifying a union of the axioms of the logic operations of the set and logic cell definitions in the technology basis;
   seventh computer readable program code for causing the computer to enumerate left parts of the identities; and
   eighth computer readable program code for causing the computer to generate corresponding right parts for each enumerated left part.

10. The computer usable medium of claim 9, wherein the identities have a depth of 2 or 3 and the seventh computer readable program code includes:

ninth computer readable program code for causing the computer to enumerate left parts of the identities having a depth of 2, and tenth computer readable program code for causing the computer to subsequently enumerate left parts of the identities having a depth of 3.

11. The computer usable medium of claim 9, wherein the eighth computer readable program code includes:

eleventh computer readable program code for causing the computer to substitute constants for variables in left parts, twelfth computer readable program code responsive to the substitution of constants caused by the eleventh computer readable program code for causing the computer to optimize the left parts, thirteenth computer readable program code responsive to the optimization caused by the twelfth computer readable program code for causing the computer to create an auxiliary system of logic equations, and fourteenth computer readable program code responsive to the optimization caused by the twelfth computer readable program code and the auxiliary system of logic equations caused by the thirteenth computer readable program code for causing the computer to create an identity.

12. The computer usable medium of claim 9, wherein the second computer readable program code includes:

fifteenth computer readable program code for causing the computer to form plural binary trees of logic cells, sixteenth computer readable program code for causing the computer to define a logic equation of a resynthesis window from a tree having an output cell having a critical timing, and seventeenth computer readable program code for causing the computer to expand the window to include additional trees that have inputs connected to the selected output cell, and eighteenth computer readable program code for causing the computer to transform the logic equations.

13. The computer usable medium of claim 12, wherein the second computer readable program code further includes:

nineteenth computer readable program code for causing the computer to iteratively repeat execution of the seventeenth and eighteenth computer readable program codes until the variables in the logic equations having critical timing have a maximal depth less than the predetermined depth.

14. The computer usable medium of claim 9, wherein the third computer readable program code includes:

twentieth computer readable program code for causing the computer to select subexpressions of the logic equations having a depths not less than 2, twenty-first computer readable program code for causing the computer to select a variable having a maximal timing operand from an identity associated with one of the subexpressions, and twenty-second computer readable program code for causing the computer to transform the selected subexpression to minimize timing of the variable.

15. The computer usable medium of claim 9, wherein the fourth computer readable program code includes:

twenty-third computer readable program code for causing the computer to identify identities having more than one variable, and twenty-fourth computer readable program code for causing the computer to transform the identified identities to remove duplicate variables.

16. The computer usable medium of claim 15, wherein the twenty-fourth computer readable program code includes:

twenty-fifth computer readable program code for causing the computer to select non-critical subexpressions of the identities, and twenty-sixth computer readable program code for causing the computer to optimize the area of the associated cells to minimize complexity.

17. Apparatus for use in designing an integrated circuit having optimal signal timing comprising:

generating means for generating a plurality of identities based on logic operations and library cells in technology basis, wherein the generating means comprises:

means for selecting a set of most frequently used logic operations in the integrated circuit, means for creating a list of initial identities identifying a union of the axioms of the logic operations of the set and logic cell definitions in the technology basis, means for enumerating left parts of the identities, and means for generating corresponding right parts for each enumerated left part;

creating means for creating a resynthesis window having less than a predetermined depth of critical variables;

transforming means for transforming logic equations from the resynthesis window using the identities; and optimizing means for optimizing the resynthesis window area.

* * * * *